United States Patent [19]

Slotboom et al.

[11] Patent Number: 5,416,343

[45] Date of Patent: May 16, 1995

[54] SEMICONDUCTOR DEVICE PROVIDED WITH A NUMBER OF PROGRAMMABLE ELEMENTS

[75] Inventors: Jan W. Slotboom; Pierre H. Woerlee; Reinout Woltjer, all of Eindhoven, Netherlands

[73] Assignee: U.S. Philips Corporation, New York, N.Y.

[21] Appl. No.: 306,854

[22] Filed: Sep. 15, 1994

Related U.S. Application Data

[63] Continuation of Ser. No. 154,334, Nov. 18, 1993, abandoned.

[30] Foreign Application Priority Data

Nov. 20, 1992 [EP] European Pat. Off. .......... 92203576
Jan. 12, 1993 [EP] European Pat. Off. .......... 93200066

[51] Int. Cl.$^6$ .................. H01L 27/10; H01L 27/04; G11C 17/00
[52] U.S. Cl. .................................... 257/209; 257/476; 257/530; 257/513; 257/910; 365/96; 365/105
[58] Field of Search ............... 257/209, 476, 530, 910; 365/96, 105

[56] References Cited

U.S. PATENT DOCUMENTS 4,881,114 11/1989 Mohsen et al. ............ 257/530
5,172,199 12/1992 Yamauchi et al. .......... 257/530

*Primary Examiner*—Gene M. Munson
*Attorney, Agent, or Firm*—Steven R. Biren

[57] ABSTRACT

A semiconductor device includes a number of programmable elements arranged in a matrix of rows and columns. The elements each have a doped semiconductor region (10) and a conductor region (20) which are mutually separated by an insulating layer (8). The conductor region (20) can be a material suitable for forming a rectifying junction (35) with the material of the semiconductor region (10). Within a row, the conductor regions of the programmable elements present therein are coupled to a common row conductor (21 ... 23), and within a column the semiconductor regions of the programmable elements situated therein are connected to a common column conductor (11 ... 14). To program an element, a programming voltage $V_{PROG}$ can be applied between the column and row conductors associated with the element to be programmed during operation, which voltage is greater than the breakdown voltage of at least a portion of the insulating layer (8) situated between the semiconductor region (10) and the conductor region (20) of the element. The programming voltage is applied with such a polarity that majority charge carriers in the semiconductor region (10) are drawn to an interface (4) between the semiconductor region (10) and the insulating layer (8), forming an accumulation layer (31) there. Between the remaining column and row conductors, on the other hand, the programming voltage is offered with an opposite polarity. Thus the programming of the matrix can take place, if so desired, by means of only a single voltage level $V_{PROG}$.

4 Claims, 3 Drawing Sheets

SEMICONDUCTOR DEVICE PROVIDED WITH A NUMBER OF PROGRAMMABLE ELEMENTS

This is a continuation of application Ser. No. 08/154,334, filed Nov. 18, 1993, now abandoned.

BACKGROUND OF THE INVENTION

The invention relates to a semiconductor device provided with a number of programmable elements which each comprise a conductor region and a doped semiconductor region separated from one another by an insulating layer, while the conductor region comprises a material which is suitable for forming a rectifying junction with the material of the semiconductor region, the said elements being arranged in a matrix of rows and columns in which within one row the conductor regions of the programmable elements are coupled to a common row conductor and within one column the semiconductor regions of the programmable elements are coupled to a common column conductor, which device is provided with programming means for applying a programming voltage for programming of an element between the column conductor and row conductor associated with this element, which voltage is greater than the breakdown voltage of at least a portion of the insulating layer situated between the conductor region and the semiconductor region of the element.

Such a device is known from U.S. Pat. No. 4,881,114. In the known device, the programmable elements form part of a memory matrix comprising a number of rows and columns of programmable memory elements. The columns of the matrix are provided with column conductors by which the semiconductor regions of the elements situated therein are coupled to one another. The column conductors are formed by elongate surface zones which were provided in a semiconductor substrate through diffusion. Similarly, the rows of the matrix are provided with row conductors by which the conductor regions of the programmable elements in one row are connected to one another. The row conductors in the known device comprise conductor tracks of polycrystalline silicon and extend in a direction transverse to the surface zones. The conductor tracks and surface zones are doped so as to have mutually opposing conductivity types and are separated from one another by a comparatively thin insulating silicon oxide layer. In this way, at each intersection of a row conductor with a column conductor a programmable element is located the conductor region of which element forms part of a conductor track and the semiconductor region of which element forms part of a surface zone.

For programming such an element, the known device is provided with programming means with which a programming voltage of the order of 30 V is applied between the column conductor and row conductor associated with the element to be programmed during a comparatively short pulse of less than 100 ms. The insulating silicon oxide layer is punctured locally by such a voltage, so that the semiconductor region and the conductor region of the element come into mutual contact and a rectifying junction is formed between them. The result is that the series resistance of the element at least in the forward direction of the formed junction changes permanently from a comparatively high value to a comparatively low value, which represents the memory contents of the element.

When an element is programmed in this way, it should be ensured that other, non-addressed elements of the matrix do not also get programmed. This latter effect can be counteracted in that a voltage difference different from the programming voltage is applied between the column and row conductors associated with the other elements. A disadvantage of this is, however, that additional measures are to be taken for generating such a different voltage level, especially where the programming means are concerned.

Furthermore, it is important for a satisfactory operation of the device that the rectifying junction formed after programming should have a comparatively good and reproducible diode characteristic.

SUMMARY OF THE INVENTION

The invention has for its object inter alia to provide a device of the kind mentioned in the opening paragraph comprising a matrix of programmable elements which can be programmed through the use of only one voltage level, if so desired, and which comprises a rectifying junction after programming which exhibits a comparatively good and reproducible diode characteristic.

According to the invention, a semiconductor device of the kind mentioned in the opening paragraph is for this purpose characterized in that the programming means apply the programming voltage between the column and row conductor associated with the element to be programmed with such a polarity that majority charge carriers are drawn towards the interface between the semiconductor region and the insulating layer in the portion of the semiconductor region adjoining the insulating layer and an accumulation layer is formed there, and in that the programming means apply a potential difference of an opposite polarity between the remaining column and row conductors of the matrix during operation.

The invention is based on the recognition that, when a potential difference is applied between a column conductor and a row conductor of the matrix, in a programmable element connected between said conductors the voltage present across the insulating layer may be considerably lower, and that this deviation from the potential difference as applied is dependent on the polarity of the potential difference applied.

It is noted in this connection that, wherever the term "conductor" is used in the present application, any material capable of conducting an electric current should be understood to be covered by this term within the scope of the invention. This term refers in particular not only to metals, metal alloys and metal compounds, but also to doped semiconductor materials. The terms column conductor and row conductor should also be given a wide interpretation within the scope of the invention in the sense that a column conductor may be any conductor track which couples the semiconductor regions of a column of programmable elements to one another, and a row conductor refers to any conductor track which interconnects the conductor regions of a row of programmable elements.

If the programming voltage is offered with the first-mentioned polarity and an accumulation layer is formed in the semiconductor region at the interface with the insulating layer, the full programming voltage will be present across the insulating layer. If a voltage with an opposite polarity is offered, by contrast, majority charge carriers are driven away from the interface and a depletion region is generated at the interface in which no free charge carriers are present. In that case the voltage applied will occur not only across the insulating layer but also partly across the generated depletion region.

The voltage applied with an opposite polarity may be of the same value as the programming voltage. It can be ensured through a suitable choice of the value of the programming voltage and the doping of the semiconductor region that the portion of the programming voltage which will be present across the insulating layer in the nonaddressed elements is smaller than the breakdown voltage of this layer. In that case, the said elements will not be programmed, although the programming voltage is applied between the column conductor and row conductor associated therewith. Thanks to the invention, accordingly, only one voltage level can suffice for addressing the entire matrix, whereby exclusively the polarity of the voltage applied determines whether an element is or is not programmed.

In addition, the programming means in the device according to the invention ensure that the rectifying junction formed is forward biased during programming. A programming current will flow through the rectifying junction as a result. The accompanying heat generation promotes an adequate mutual penetration of the materials of the semiconductor region and the conductor region, which results in the formation of a rectifying junction in a reproducible manner and with a comparatively good diode characteristic.

BRIEF DESCRIPTION OF THE DRAWING

The invention will now be explained in more detail with reference to an embodiment and a drawing, in which.

The Figures are purely diagrammatic and not drawn to scale. In particular, some dimensions are strongly exaggerated for reasons of clarity. Semiconductor regions of the same conductivity type are generally hatched in the same direction, and corresponding parts are given the same reference numerals.

DESCRIPTION OF THE PREFERRED EMBODIMENT

Figure 1:
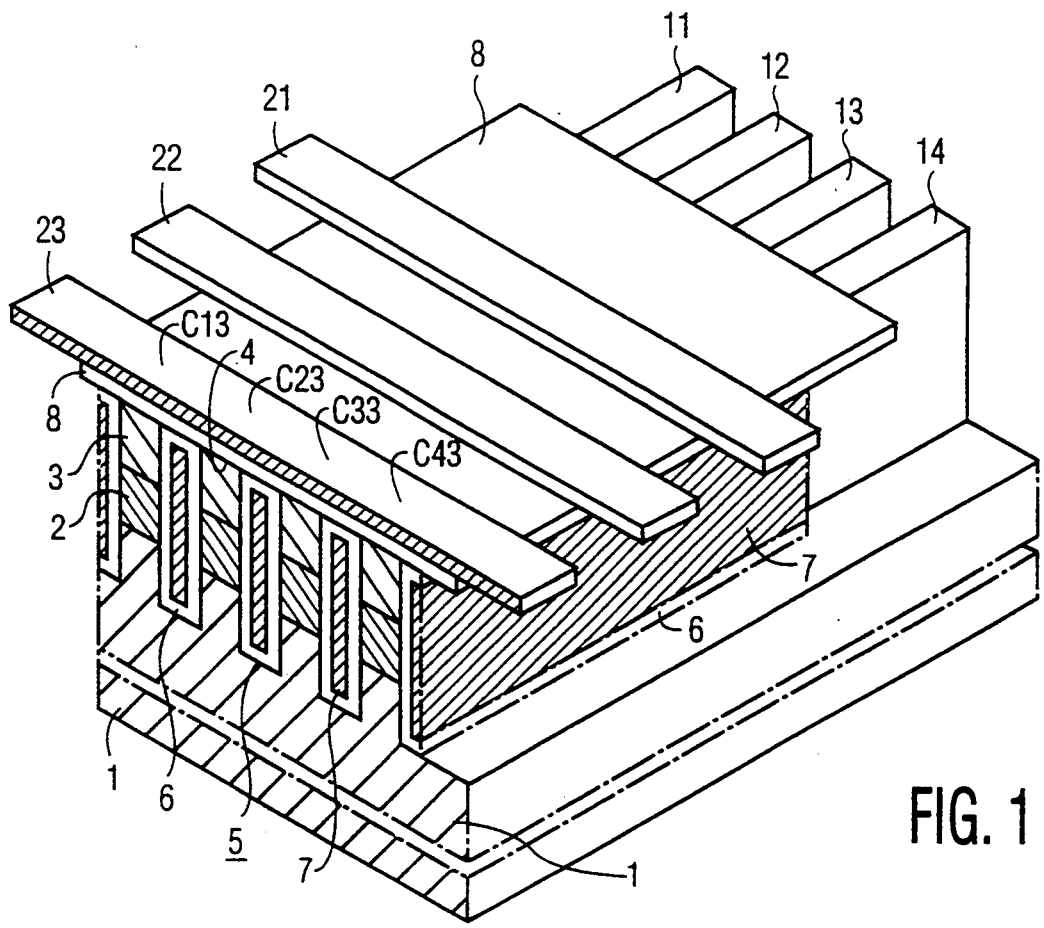
FIG. 1 is a perspective view of a portion of an embodiment of the device according to the invention.

In the embodiment of FIG. 1, the invention is used in a memory matrix in which the programmable elements each form a memory cell of the matrix. The memory cells are arranged in rows and columns of which three and four are drawn in the Figures, respectively. The device is provided in a silicon semiconductor body comprising a monocrystalline n-type substrate 1 on which a p-type silicon layer 3 was epitaxially grown. The substrate is doped with arsenic in a concentration of approximately $10^{16}$ cm$^{-3}$, and the epitaxial layer comprises boron in a concentration of approximately $10^{16}$ cm$^{-3}$. A buried layer 2 of the same conductivity type as the overlying epitaxial layer but with a substantially higher boron concentration of approximately $10^{19}$ cm$^{-3}$ lies at the interface between the substrate 1 and the epitaxial layer 3. The substrate 1 is connected to ground during operation, as is indicated diagrammatically in the Figure.

The semiconductor body 1, 2, 3 is provided at a main surface 4 with a number of mutually parallel longitudinal grooves 5 which extend down to and into the substrate 1. The approximately 0.25 μm wide and more than 1 μm deep grooves 5 are coated with an approximately 10 nm thick dielectric layer 6 of silicon oxide, and are further filled up with a suitable filler 7, such as n-type polycrystalline silicon in the present case. The epitaxial layer 3 together with the subjacent buffed layer 2 is divided into a number of parallel and mutually isolated tracks 11 . . . 14 by means of the grooves. The tracks are approximately 0.25 μm wide and form column conductors of the memory matrix. The comparatively heavily doped buried layer 2 ensures a sufficiently low series resistance here.

The semiconductor body 1, 2, 3 is covered at the main surface 4 with an approximately 10 nm thick insulating layer 8 of, in that order, 2 nm silicon oxide, approximately 6 nm silicon nitride, and approximately 2 nm silicon oxide. A number of mutually parallel conductor tracks 21 . . . 23 of n-type polycrystalline silicon are provided on the insulating layer 8. The interspacing between the conductor tracks is approximately 0.25 82 m. The conductor tracks 21 . . . 23 are approximately 0.25 μm wide and form row conductors for the matrix. To achieve a suitably low series resistance thereof, the conductor tracks 21 . . . 23 are given a comparatively heavy doping concentration of approximately 10 <cm$^{-3}$.

Figure 2:
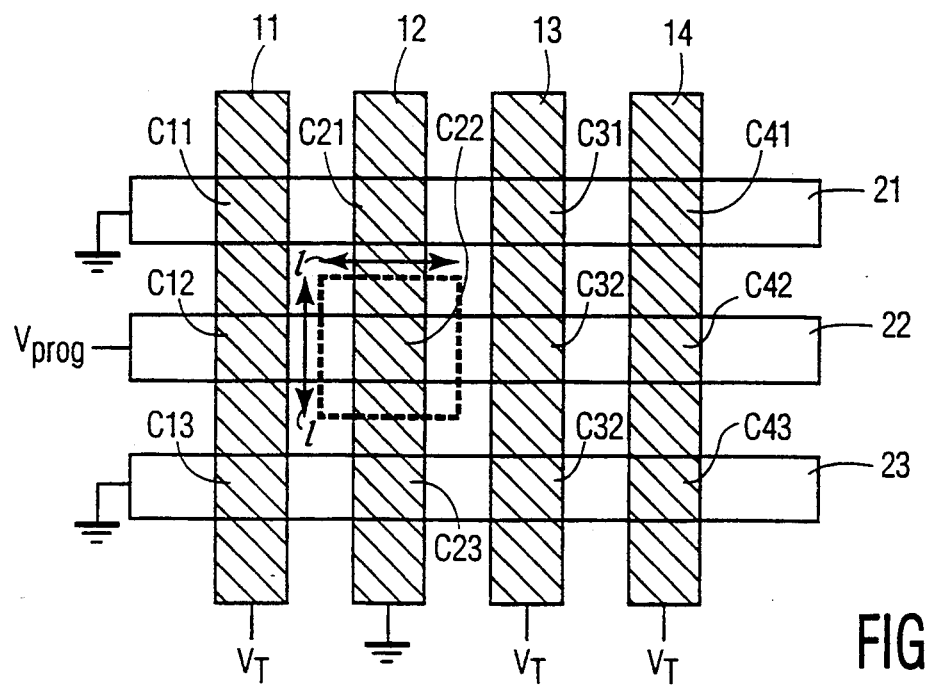
FIG. 2 is a plan view of the device of FIG. 1.
Figure 3:
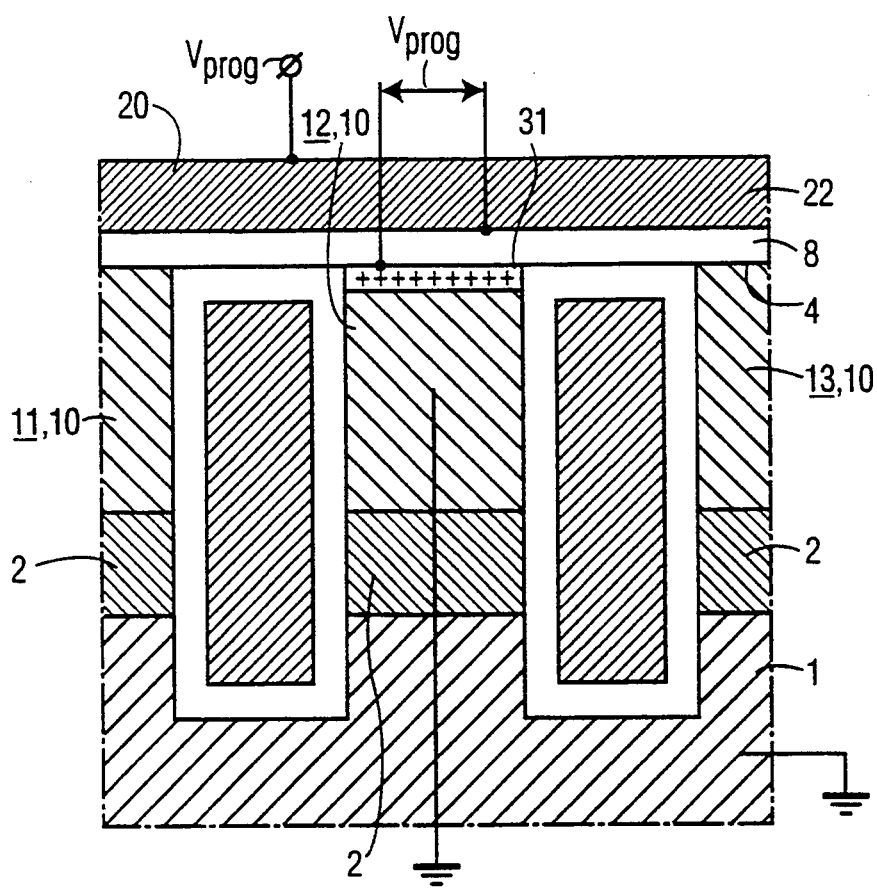
FIG. 3 is a cross-section of a programmable element of the device of FIG. 1 before programming.
Figure 4:
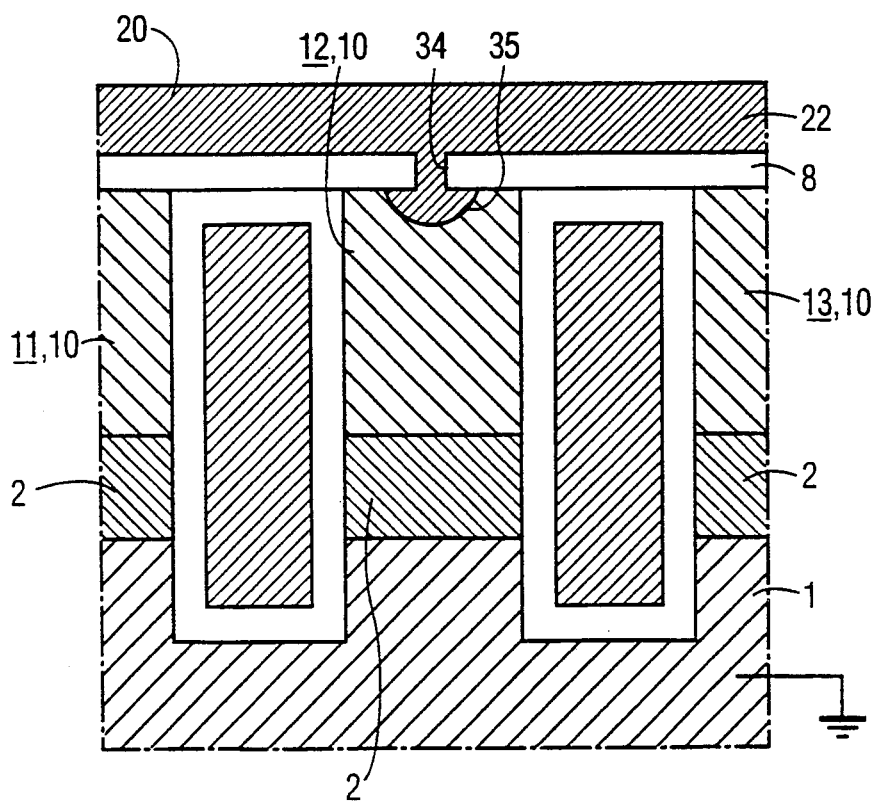
FIG. 4 shows the element of FIG. 3 after programming.

A memory cell C11 . . . C43 of the matrix is present at each crossing of a column conductor 11 . . . 14 with a row conductor 21 . . . 23, as is shown in FIG. 2 in a plan view of the device. The cells C22, C31 and C12 are shown separately in cross-section in FIGS. 3, 4, FIG. 5, and FIG. 6, respectively.

The memory cells each comprise a semiconductor region 10 which forms pan of the associated column conductor 11 . . . 14, and a conductor region 20 which forms part of the row conductor 21 . . . 23 associated with the relevant memory cell. The insulating layer 8 is present between the conductor region 20 and the semiconductor region 10.

The device is provided with programming means (not shown) for programming a memory cell in the matrix. A programming voltage $V_{PROG}$ of approximately 12 V is applied thereby between the column conductor and row conductor associated with the element to be programmed. For programming the memory cell C22, for example, the programming voltage $V_{PROG}$ of 12 V is applied between the column conductor 12 and the row conductor 22 by the programming means. According to the invention, the polarity of the voltage $V_{PROG}$ is such that the potential of the n-type conductor region 20, in this example forming part of the row conductor 22, is negative relative to the potential of the accompanying p-type semiconductor region 10, in this case forming part of the column conductor 12. All this is realized in the present example in that the relevant row conductor 22 is connected to a potential of approximately −12 V and the relevant column conductor 12 is connected to a reference potential, for example ground. In that case majority charge carriers, i.e. holes, are drawn towards the main surface 4 in the semiconductor region 10, so that an increased density of majority charge carriers is created at the interface with the insulating layer 8, which results in an accumulation layer 31 at the surface 4 of the semiconductor region 10, as is shown diagrammatically in FIG. 3. The full programming voltage $V_{PROG}$ of approximately 12 V is then present across the insulating layer 8.

The (absolute) value of the programming voltage $V_{PROG}$ is chosen to be higher than the breakdown voltage of the insulating layer 8, which is approximately 10 V in the layer used here. As a result, breakdown will occur in the insulating layer 8 at a weak spot. N-type silicon of the conductor region 20 and p-type silicon of the semiconductor region 10 will come into mutual contact through the opening 34 created thereby in the insulating layer 8, and a rectifying pn junction 35 is formed, see FIG. 4. The polarity of the applied programming voltage is such that the rectifying junction 35 formed is forward biased, so that the junction 35 carries a programming current which, owing to the heat generation caused by this current and the induced silicon recrystallization leads to a junction 35 which has a reproducible rectifying characteristic of good quality. Once programmed, the element permanently has a comparatively low series resistance at least in the forward direction of the junction 35 formed, which is in contrast to the unprogrammed state in which the insulating layer 8 is intact and provides an adequate electrical isolation between the two regions 10, 20.

It should be noted here that, although the rectifying junction 35 is drawn exclusively in the semiconductor region 10, it is possible in practice for material of the semiconductor region to penetrate the conductor region 20 through the opening 34 in the insulating layer 8. In that case the rectifying junction 35 will lie at least partly also in the conductor region 20 after programming.

To ensure that the other memory cells are not also programmed, the programming means are so constructed according to the invention that a voltage $V_T$ of opposite polarity is offered between the remaining column and row conductors of the matrix, as indicated in FIG. 2 where the remaining row conductors 21, 23 are connected to ground and the remaining column conductors 11, 13, 14 to a potential $V_T$ of the same sign as the potential $V_{PROG}$ of the row conductor 22 associated with the element to be programmed. The (absolute) value of the voltage $V_T$ may be chosen to be equal to that of the programming voltage $V_{PROG}$. In memory cells which lie in the same row or in the same column as the memory cell C22 to be programmed, no voltage will be across the insulating layer 8 in that case, so that these cells remain unprogrammed.

Figure 5:
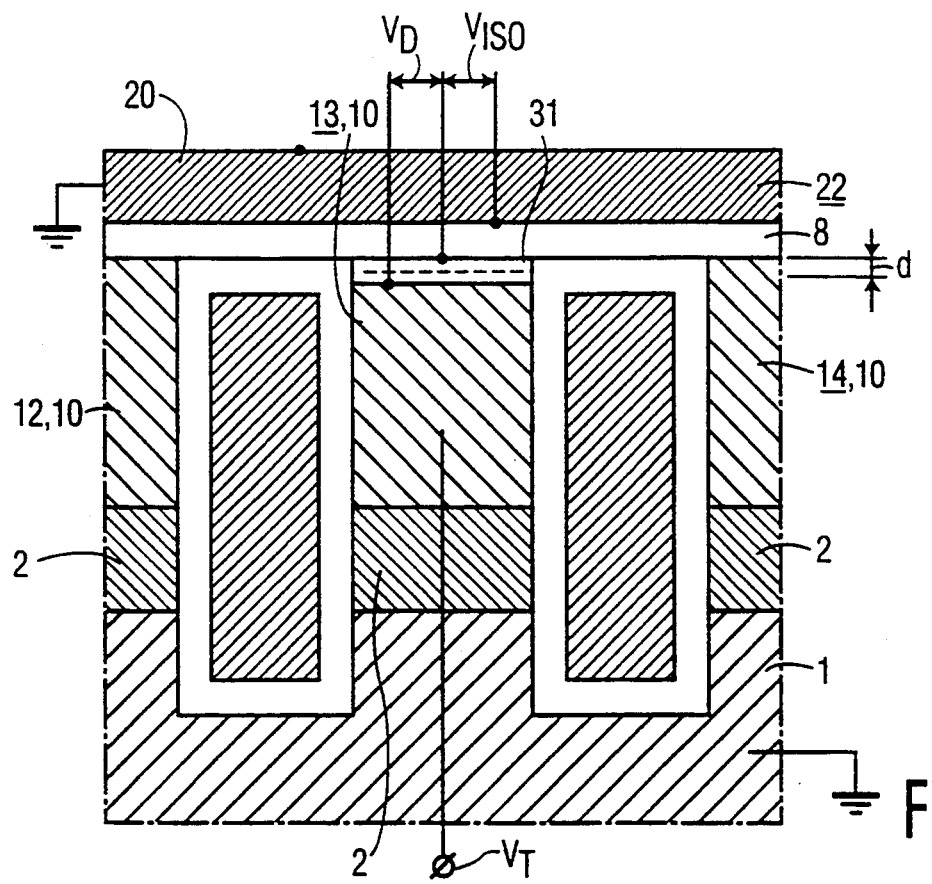
FIG. 5 is a cross-section of a further programmable element of the device of FIG. 1.

In the remaining cells such as, for example, memory cell C31 shown in cross-section in FIG. 5, the voltage of the p-type semiconductor region 10 is negative relative to the conductor region 20, so that majority charge carriers, i.e. holes, are driven away from the surface 4. As a result, a depletion region 32 is formed in these cells at the surface 4 across which a portion $V_D$ of the total voltage $V_T$ will be present. The value of the voltage drop $V_D$ across the depletion region 32 depends on the thickness d of the depletion region 32 and is thus associated with the doping concentration in the semiconductor region 10 and with the value of the applied voltage $V_T$. Only the remaining portion $V_{ISO}$ of the voltage $V_T$, for which it is true that: $|V_{ISO}| = |V_T| - |V_D|$, will be present across the insulating layer 8 of the memory cell C31 which is not to be programmed. In the present example, with a voltage $V_T$ of the same (absolute) value as the programming voltage $V_{PROG}$ of 12 V, the voltage drop across the depletion region 32 generated thereby will be approximately 4 V. The remaining voltage drop across the insulating layer 8 is approximately 8 V, which is insufficient for causing breakdown of the layer 8. According to the invention, in this manner it can be prevented that memory cells are inadvertently programmed, while no more than a single voltage level $V_{PROG}$ suffices for addressing and programming.

Figure 6:
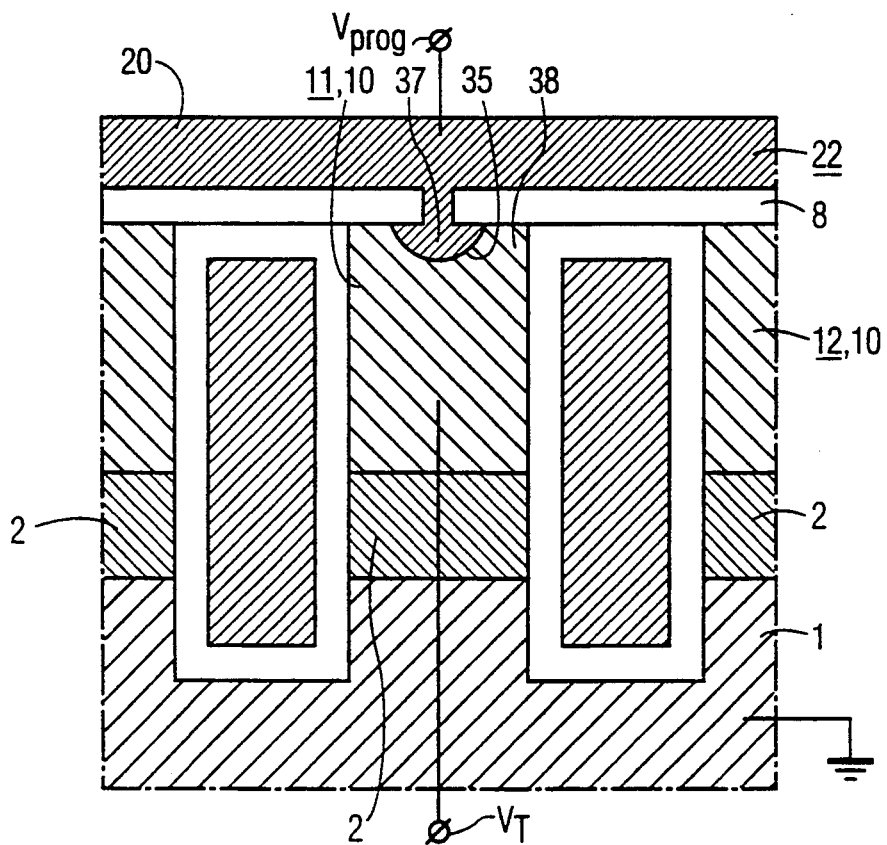
FIG. 6 is a cross-section of another further programmable element of the device of FIG. 1.

FIG. 6 is a cross-section of a programmed memory cell C12 in the same row as the cell C22 yet to be programmed. The programmed cell C12 by this time comprises a rectifying junction 35. The Figure diagrammatically indicates the potentials which are applied to the column and row conductors 11, 12 associated with the drawn cell C12 drawn for the purpose of programming the cell C22. The potentials $V_{PROG}$, $V_T$ of the cathode 37 and anode 38, respectively, of the junction 35 have the same sign, while the potential of the cathode will initially have the value of the programming voltage.

As soon as the insulating layer 8 in the element C22 to be programmed is punctured under the influence of the programming voltage, however, and a programming current starts to flow therein, a voltage drop will occur in the associated row conductor 22. As a result, the potential of cathode 37 will rise to above the level of the programming voltage. If the voltage $V_T$ is chosen to have the same value as the programming voltage, the junction in the already programmed cell will not become forward biased.

Although the invention was described with reference to only a single embodiment, it will be apparent that the invention is by no means limited to the example given. Many variations and embodiments are possible to those skilled in the art without departing from the scope of the invention.

Thus the conductivity types may be, all simultaneously, replaced by the opposite conductivity types. In that case, according to the invention, the conductor region of an element to be programmed is connected to a programming voltage whose polarity is positive relative to the associated semiconductor region. Electrons are then drawn to the surface in the n-type semiconductor region, and an accumulation layer of electrons is formed in a corresponding manner. In the cells where the programming voltage is applied with an opposite polarity, on the other hand, electrons are driven away from the surface and a depletion region arises.

Furthermore, the materials used may be replaced by alternative suitable materials. In particular, a Schottky metal may be used for the conductor region, which forms a rectifying Schottky junction in contact with the semiconductor material of the semiconductor region after programming.

Instead of isolating grooves, oxide regions obtained through local oxidation of the semiconductor body or pn isolation may be used for isolating adjacent semiconductor regions from one another. Although this will often be to the detriment of the packing density, the device according to the invention will thereby be readily adaptable to most present-day semiconductor processes.

Besides as a memory cell, the programmable elements of the device according to the invention may also be used, for example, for redundancy applications or in a programmable logic circuit (PLD) in which the elements form programmable logic switches. In particular, it is possible in that case for the programmable element to form, instead of a diode, a transistor in a selective manner, in which latter case the transition formed through programming constitutes, for example, the emitter-base junction of a bipolar transistor.

Generally speaking, the invention provides a semiconductor device with programmable elements which can be programmed by comparatively simple programming means.

We claim:

1. A semiconductor device provided with a plurality of programmable elements which each comprise a conductor region and a doped semiconductor region separated from one another by an insulating layer, the conductor region comprising a material which is suitable for forming a rectifying junction with the material of the semiconductor region, said elements being arranged in a matrix of rows and columns in which within one row the conductor regions of the programmable elements are coupled to a common row conductor and within one column the semiconductor regions of the programmable elements are coupled to a common column conductor, said device being provided with programming means for applying a programming voltage for programming of an element between the column conductor and row conductor associated with this element, said voltage being greater than the breakdown voltage of at least a portion of the insulating layer situated between the conductor region and the semiconductor region of the element, characterized in that in operation the programming means apply the programming voltage across the insulating layer between the column conductor and row conductor associated with the element to be programmed with such a polarity that majority charge carriers are drawn towards the interface between the semiconductor region and the insulating layer in the portion of the semiconductor region adjoining the insulating layer to form an accumulation layer there, and in that in operation the programming means apply a voltage of an opposite polarity across the insulating layer between column and row conductors forming other programmable elements, the surface dopant concentration in the doped semiconductor regions being sufficiently low such that, as a result of said voltage of opposite polarity, a depletion zone adjoining the insulating layer is formed in the doped semiconductor regions of said other elements.

2. A semiconductor device as claimed in claim 1, characterized in that the breakdown voltage of the rectifying junction formed is greater than the voltage of opposite polarity.

3. A semiconductor device as claimed in claim 1, characterized in that the column conductors are formed by at least substantially parallel, mutually isolated elongated semiconductor zones which comprise the semiconductor regions and in that the row conductors are formed by at least substantially parallel, mutually isolated conductor tracks which comprise the conductor regions and which extend in a direction transverse to the longitudinal direction of the semiconductor zones.

4. A semiconductor device as claimed in claim 3, characterized in that the semiconductor zones are p-type doped, in that the semiconductor tracks are n-type doped, and in that the programming means are so configured that, for programming an element, a negative potential is applied to the conductor track associated therewith relative to the potential of the semiconductor zone associated with the element.

* * * * *